US009225369B2

(12) United States Patent
Vahid Far et al.

(10) Patent No.: US 9,225,369 B2
(45) Date of Patent: Dec. 29, 2015

(54) FILTERING BLOCKER COMPONENTS OF A SIGNAL

(71) Applicant: QUALCOMM Incorporated, San Diego, CA (US)

(72) Inventors: Mohammad Bagher Vahid Far, San Jose, CA (US); Abbas Komijani, Mountain View, CA (US); Amirpouya Kavousian, San Jose, CA (US); Mazhareddin Taghivand, Campbell, CA (US); Alireza Khalili, Sunnyvale, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/158,225

(22) Filed: Jan. 17, 2014

(65) Prior Publication Data

US 2015/0207531 A1   Jul. 23, 2015

(51) Int. Cl.

| H04B 1/10 | (2006.01) |
|---|---|
| H04B 1/04 | (2006.01) |
| H04B 1/12 | (2006.01) |
| H03F 1/22 | (2006.01) |
| H03F 1/32 | (2006.01) |
| H03F 3/195 | (2006.01) |
| H03F 3/21 | (2006.01) |
| H03F 3/68 | (2006.01) |
| H03H 11/00 | (2006.01) |
| H03F 1/56 | (2006.01) |

(52) U.S. Cl.
CPC .................. *H04B 1/12* (2013.01); *H03F 1/223* (2013.01); *H03F 1/3223* (2013.01); *H03F 1/56* (2013.01); *H03F 3/195* (2013.01); *H03F 3/211* (2013.01); *H03F 3/68* (2013.01); *H03H 11/00* (2013.01); *H03F 2200/171* (2013.01); *H03F 2200/222* (2013.01); *H03F 2200/294* (2013.01)

(58) Field of Classification Search
USPC .......... 455/114.1, 114.2, 127.2, 232.1, 234.1, 455/296, 304, 311, 306, 307; 330/278, 149
See application file for complete search history.

(56) References Cited

U.S. PATENT DOCUMENTS

| 4,130,811 | A | * | 12/1978 | Katz et al. ..................... 342/200 |
|---|---|---|---|---|
| 4,772,856 | A | * | 9/1988 | Nojima et al. ................. 330/251 |
| 4,811,422 | A | * | 3/1989 | Kahn .......................... 455/114.1 |
| 5,172,072 | A | * | 12/1992 | Willems et al. ............... 330/149 |
| 7,911,269 | B2 | | 3/2011 | Yang et al. |
| 8,094,025 | B2 | | 1/2012 | Safarian et al. |
| 8,385,872 | B2 | | 2/2013 | Muthali et al. |
| 2003/0071684 | A1 | * | 4/2003 | Noori ........................... 330/149 |

(Continued)

FOREIGN PATENT DOCUMENTS

EP    1684416 A1    7/2006

OTHER PUBLICATIONS

Samavati, H. et al., "A 5-GHz CMOS Wireless LAN Receiver Front End", IEEE Journal of Solid-State Circuits, vol. 35, No. 5, May 2000, pp. 765-772.

(Continued)

*Primary Examiner* — Nguyen Vo

(57) ABSTRACT

An apparatus includes a main amplifier configured to receive an input signal. The main amplifier is also configured to generate an output signal. The apparatus also includes an auxiliary path configured to phase-shift the input signal to generate a cancellation signal to reduce or cancel a blocker component of the output signal.

20 Claims, 7 Drawing Sheets

(56) References Cited

U.S. PATENT DOCUMENTS

| | | | |
|---|---|---|---|
| 2003/0214359 A1* | 11/2003 | Sasho et al. | 330/310 |
| 2007/0205943 A1* | 9/2007 | Nassiri-Toussi et al. | 342/377 |
| 2007/0264943 A1* | 11/2007 | Darabi | 455/88 |
| 2008/0009258 A1* | 1/2008 | Safarian et al. | 455/307 |
| 2009/0201089 A1* | 8/2009 | Kawanabe et al. | 330/277 |
| 2010/0112971 A1 | 5/2010 | Matsuno et al. | |
| 2012/0032742 A1* | 2/2012 | Hsieh et al. | 330/285 |
| 2013/0095776 A1 | 4/2013 | Kavousian et al. | |
| 2013/0182792 A1 | 7/2013 | Wyville | |
| 2013/0203369 A1 | 8/2013 | Dogan et al. | |

OTHER PUBLICATIONS

Murphy, et al., "A Blocker-Tolerant Wideband Noise-Cancelling Receiver with a 2dB Noise Figure", ISSCC 2012, Session 4, RF Techniques—4.1, Feb. 20, 2012, 3 pp.

Andriesei, Cristian, "Filtering Low Noise Amplifiers for Saw-Less CMOS Receivers," Dec. 31, 2013, XP055180153, Retrieved from the Internet: URL:http://www.bulipi-eee.tuiasi.ro/archive/2013/fasc.1/p1_f1_2013.pdf [retrieved on Mar. 30, 2015], pp. 13-14.

Darabi, Hooman, "A Blocker Filtering Technique for SAW-Less Wireless Receivers," IEEE Journal of Solid-State Circuits, vol. 42, No. 12, pp. 2766, 2773, Dec. 2007.

International Search Report and Written Opinion—PCT/US2015/011384—ISA/EPO—Apr. 10, 2015, 12 pages.

Meyer, Robert G. et al., "Blocking and Desensitization in RF Amplifiers," IEEE Journal of Solid-State Circuits, IEEE Service Center, Piscataway, NJ, USA, vol. 30, No. 8, Aug. 1, 1995, pp. 944-946, XP000524394, ISSN: 0018-9200, DOI: 10.1109/4.400438.

Zhang, Heng et al., "Linearization Techniques for CMOS Low Noise Amplifiers: A Tutorial," IEEE Transactions on Circuits and Systems I: Regular Papers, IEEE, US, vol. 58, No. 1, Jan. 1, 2011, pp. 22-36, XP011340986, ISSN: 1549-8328, DOI: 10.1109/TCSI.2010.2055353.

Bevilacqua, Andrea et al., "A 0.13µm CMOS LNA with Integrated Balun and Notch Filter for 3-to-5GHz UWB Receivers," ISSCC 2007, Session 23, Broadband RF and Radar—23.2, Feb. 14, 2007, 3 pages.

* cited by examiner

FILTERING BLOCKER COMPONENTS OF A SIGNAL

I. FIELD

The present disclosure is generally related to filtering blockers.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones may receive signals at a receiver. The signals may include components having a "target" frequency and components having "blocker" frequencies. As a non-limiting example, wireless telephones may process received signals at 1.8 GHz (e.g., the target frequency). However, the receiver may also receive signals (e.g., blockers) at other frequencies (e.g., blocker frequencies). Powerful blockers may desensitize low noise amplifiers (LNAs) in the receiver in wide band receiving applications.

III. BRIEF DESCRIPTION OF THE DRAWINGS

IV. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
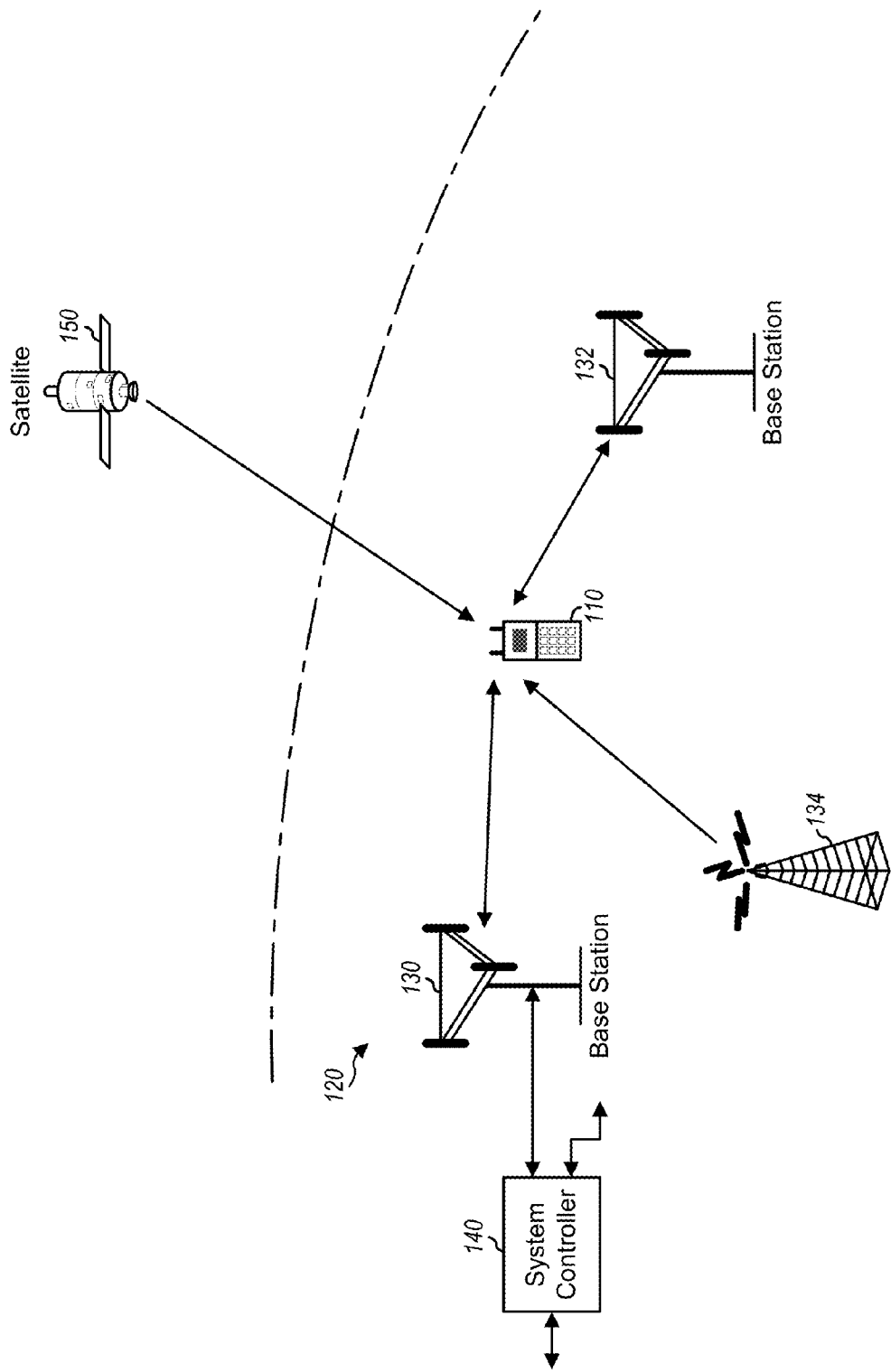
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Figure 2:
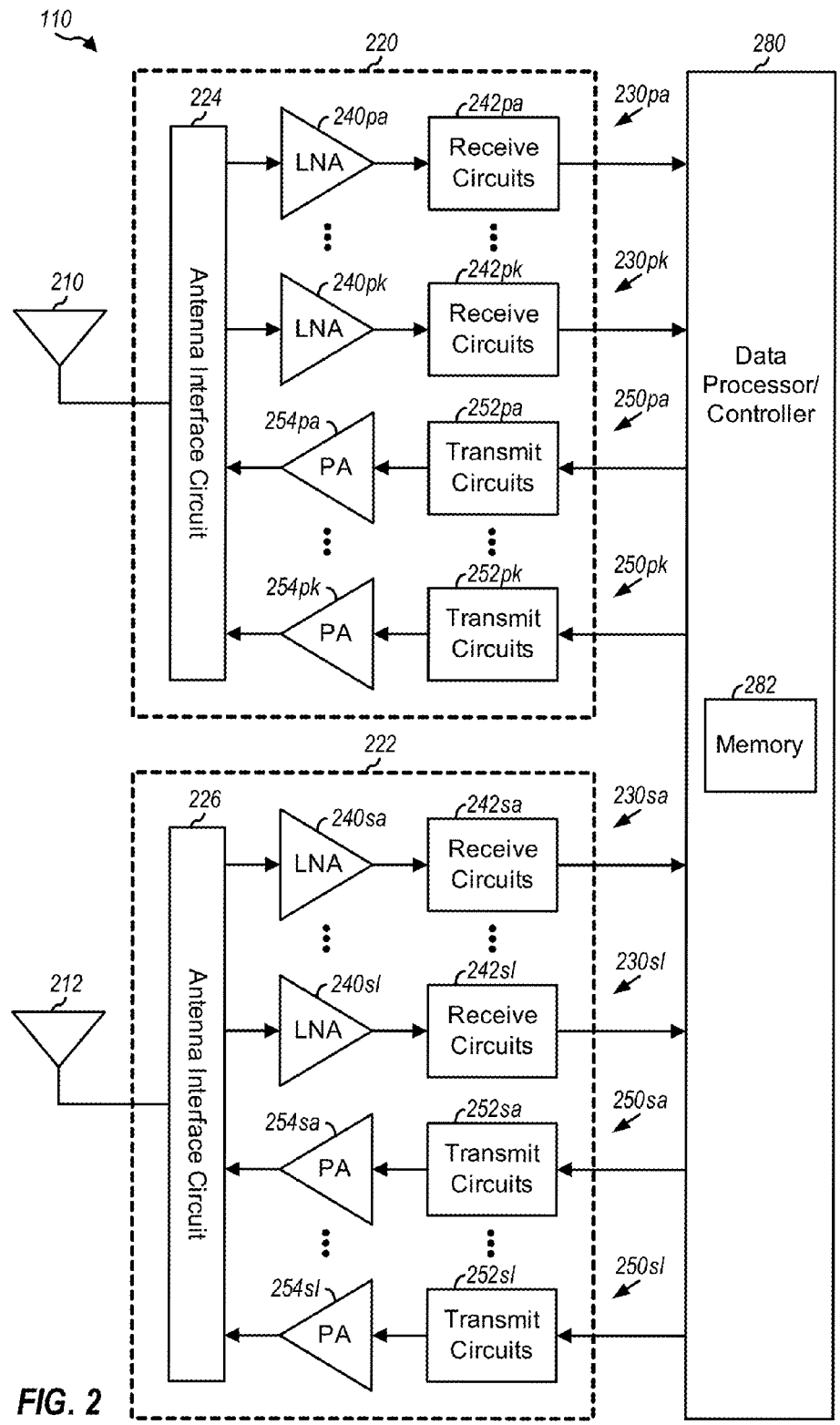
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230*pa* to 230*pk* and multiple (K) transmitters 250*pa* to 250*pk* to support multiple frequency bands, multiple radio technologies, carrier aggregation, etc. Transceiver 222 includes multiple (L) receivers 230*sa* to 230*s*1 and multiple (L) transmitters 250*sa* to 250*s*1 to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230*pa* is the selected receiver. Within receiver 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250 includes transmit circuits 252 and a power amplifier (PA) 254. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RFICs (RFICs), mixed-signal ICs, etc. For example, LNAs 240 and receive circuits 242 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Figure 3:
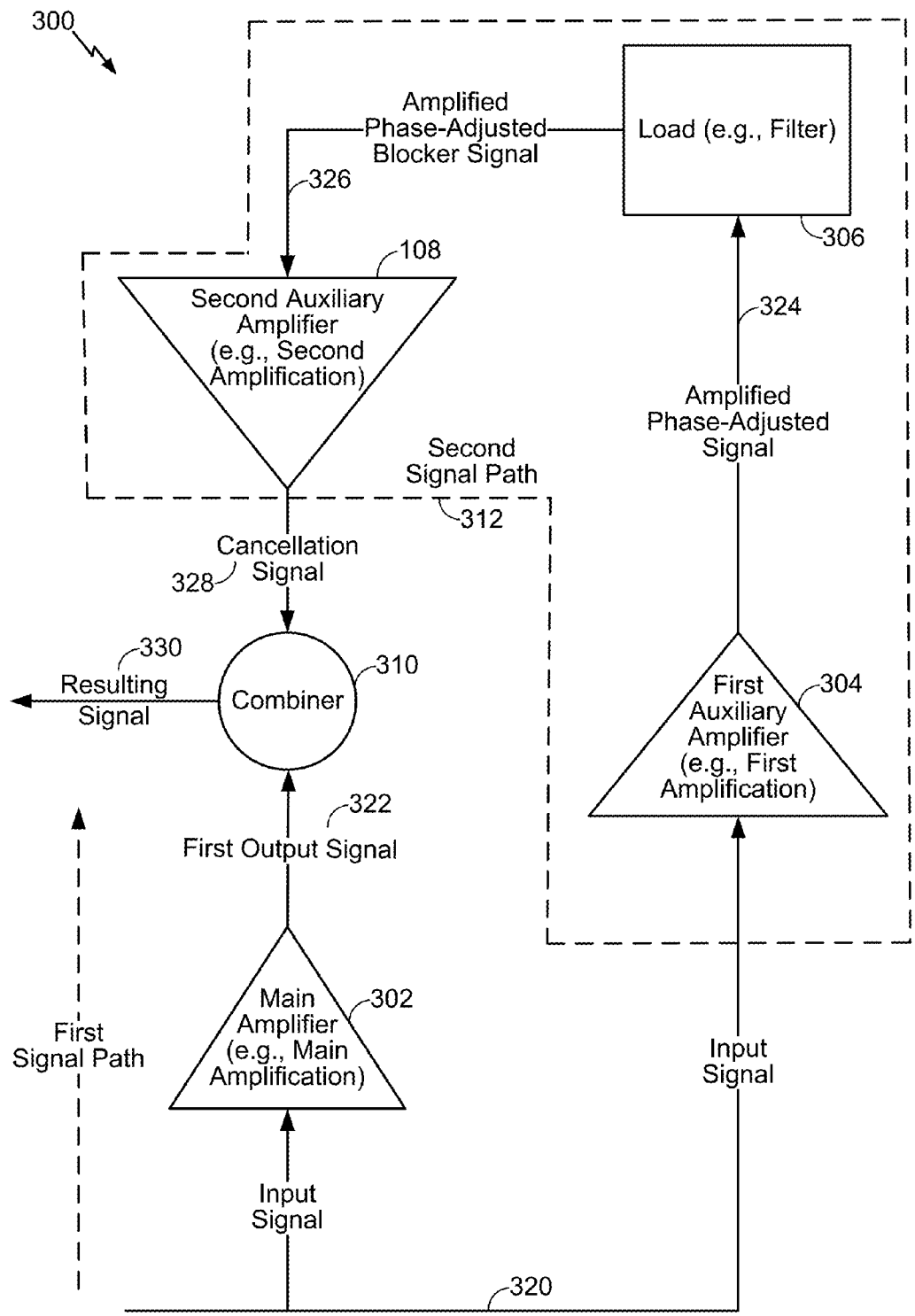
FIG. 3 is a block diagram that depicts an exemplary embodiment of a system that is operable to amplify signal components and reduce blocker components.

Referring to FIG. 3, an exemplary embodiment of a system 300 that is operable to amplify signal components and reduce blocker components is shown. The system 300 includes a main amplifier 302, a first auxiliary amplifier 304, a load 306, a second auxiliary amplifier 308, and a combiner 310. The main amplifier 302 may be included in a first signal path (e.g., a main signal path). The first auxiliary amplifier 304, the load 306, and the second auxiliary amplifier 308 may be included in a second signal path 312 (e.g., a feed-forward path) that is configured to reduce (or cancel) blocker components from the first signal path as described herein. In an exemplary embodiment, the system 300 may correspond to a low noise amplifier (LNA). In other embodiments, the system 300 may correspond to other amplifiers (e.g., a power amplifier, a radio frequency (RF) power amplifier, etc.). The system 300, including the first signal path and the second signal path 312, may be included in a wideband receiver.

An input signal 320 may be provided to the main amplifier 302 and to the first auxiliary amplifier 304. In an exemplary embodiment, the input signal 320 may correspond to an RF signal. The input signal 320 may include signal components and blocker components. For example, the signal components may correspond to a target signal having a target frequency, and the blocker components may correspond to blocker signals having blocker frequencies.

In an exemplary embodiment, the blocker components may be a harmonic of the signal components. As a non-limiting example, the signal component may have a frequency of 3.8 gigahertz (GHz), and a blocker component may have a frequency of 5.4 GHz (e.g., the third harmonic). In an exemplary embodiment, the blocker components may be transmitted from the same source as the signal components. In another embodiment, the blocker components and the signal components may be transmitted from different sources. In an exemplary embodiment, the blocker components are independent of a transmission frequency associated with signals transmitted by a device in which the system 300 is integrated. As described in greater detail with respect to FIG. 5, in an exemplary embodiment, the input signal 320 may include multiple (different) blocker signals having multiple (different) blocker frequencies (e.g., notch frequencies). As used herein, "signal component" and "target signal" may be used interchangeably. In addition, "blocker component" and "blocker signal" may be used interchangeably.

The main amplifier 302 is coupled to receive the input signal 320. The main amplifier 302 is configured to amplify the input signal 320 to generate a first output signal 322 (e.g., a first amplified signal). For example, the main amplifier 302 may perform a "main amplification" and amplify the signal components and the blocker components of the input signal 320 by a main gain factor. The first output signal 322 may include signal components having the target frequency and blocker components having the blocker frequency. The first output signal 322 may be provided to a first input of the combiner 310.

The first auxiliary amplifier 304 is also coupled to receive the input signal 320. The first auxiliary amplifier 304 is configured to amplify the input signal 320 and to adjust a phase of the input signal 320. For example, the first auxiliary amplifier 304 may perform a "first amplification" and amplify the signal components and the blocker components of the input signal 320 by a first gain factor. In an exemplary embodiment, the first gain factor may be less than the main gain factor associated with the main amplifier 302. The first auxiliary amplifier 304 may adjust the phase of the input signal 320 by an amount to reduce the blocker components, as described below. For example, in an exemplary embodiment, the first auxiliary amplifier 304 may also adjust the phase of the input signal 320 by approximately 180 degrees. Performing the first amplification and adjusting the phase of the input signal 320 at the first auxiliary amplifier 304 produces an amplified phase-adjusted signal 324. The amplified phase-adjusted signal 324 may be provided to the load 306.

The load 306 is coupled to receive the amplified phase-adjusted signal 324. The load 306 may operate as a filter (e.g., a notch filter) that is tuned to the blocker frequency. In an exemplary embodiment, the load 306 may include one or more inductor-capacitor (LC) circuits (e.g., variable LC circuits) that are programmable by a controller. For example, each LC circuit may include an array of capacitors having variable sizes (capacitances) that are responsive to switches and/or an array of inductors that are responsive to switches. For example, each switch may be selectively activated based on a digital code from the controller (e.g., a code stored in a memory (e.g., a read-only memory (ROM) or a random access memory (RAM)). Activating and/or deactivating the switches may adjust the capacitance and/or the inductance of the LC circuit, which in turn may adjust a frequency (e.g., the blocker frequency) to which the load 306 is tuned.

The load 306 may be configured to remove components of the amplified phase-adjusted signal 324 that are associated with the target frequency (e.g., remove signal components). The load 306 may pass components of the phase-adjusted signal 324 that are associated with the blocker frequency (e.g., blocker components) to generate an amplified phase-adjusted blocker signal 326 having the blocker frequency. The amplified phase-adjusted blocker signal 326 may be provided to the second auxiliary amplifier 308.

The second auxiliary amplifier 308 is coupled to receive the amplified phase-adjusted blocker signal 326. The second auxiliary amplifier 308 is configured to amplify the amplified phase-adjusted blocker signal 326 to generate a cancellation signal 328 having the blocker frequency. For example, the second auxiliary amplifier 308 may perform a "second amplification" and amplify the amplified phase-adjusted blocker signal 326 by a second gain factor. The cancellation signal 328 may be provided to a second input of the combiner 310.

The amplitude of the blocker components in the first output signal 322 from the main amplifier 302 may be approximately equal to the amplitude of the blocker components in the cancellation signal 328 from the second signal path 312. For example, the amplitude of the blocker components from the main amplification may be approximately equal to the amplitude of the blocker components resulting from the first amplification and the second amplification. In addition, the first output signal 322 may be approximately 180 degrees out of phase with the cancellation signal 328. For example, the phase shift of the input signal 320 at the first auxiliary amplifier 304 may result in the first output signal 322 being approximately 180 degrees out of phase with the cancellation signal 328. Thus, the blocker components in the first output signal 322 from the main amplifier 302 and the blocker components in the cancellation signal 328 from the second signal path 312 have approximately equal amplitudes and are approximately 180 degrees out of phase.

The combiner 310 may combine the first output signal 322 with the cancellation signal 328 to generate a resulting signal 330 having the target frequency. For example, the cancellation signal 328 may reduce (or cancel) blocker components of the first output signal 322, and the signal components (e.g., components having the target frequency and amplified by the main amplifier 302) of the first output signal 322 may be provided as the resulting signal 330. In an exemplary embodiment, the resulting signal 330 may be a single-ended resulting signal. In other embodiments, the resulting signal 330 may be a differential resulting signal as described with respect to FIG. 6.

Although the system 300 is illustrated as including the first auxiliary amplifier 304, the load 306, and the second auxiliary amplifier 308, in other exemplary embodiments, the system 300 may include alternative configurations. For example, in an exemplary embodiment, the load 306 may be included within the first auxiliary amplifier 304. In another exemplary embodiment, the components of the first auxiliary amplifier 304, the components of the load 306, and the components of the second auxiliary amplifier 308 may be included in a single auxiliary amplifier that is configured to generate the cancellation signal 328. In yet another exemplary embodiment, the first auxiliary amplifier 304 and the second auxiliary amplifier 308 may include filtering circuitry. For example, the first auxiliary amplifier 304 and the second auxiliary amplifier 308 may include circuitry (e.g., capacitors, inductors, etc.) that is tuned to filter (e.g., remove) signal components and pass blocker components.

The system 300 of FIG. 3 may reduce (or cancel) blocker components in an amplified version of the input signal 320. For example, the main amplifier 302 may pass signal components and blocker components to the combiner 310, and the load 306 may filter out (e.g., remove) signal components such that blocker components (that are phase adjusted) are passed to the combiner 310. Blocker reduction (or cancellation) may occur at the combiner 310 (e.g., the output of the system 300). For example, the amplitude of the blocker components provided by the main amplifier 302 may be approximately equal to the amplitude of the blocker components provided by the second signal path 312 (e.g., the first auxiliary amplifier 304 and the second auxiliary amplifier 308). In addition, the blocker components provided by the second signal path 312 have an opposite phase (e.g., a 180 degree phase shift) as the blocker components provided by the main amplifier 302, which causes blocker cancellation (or reduction).

Figure 4:
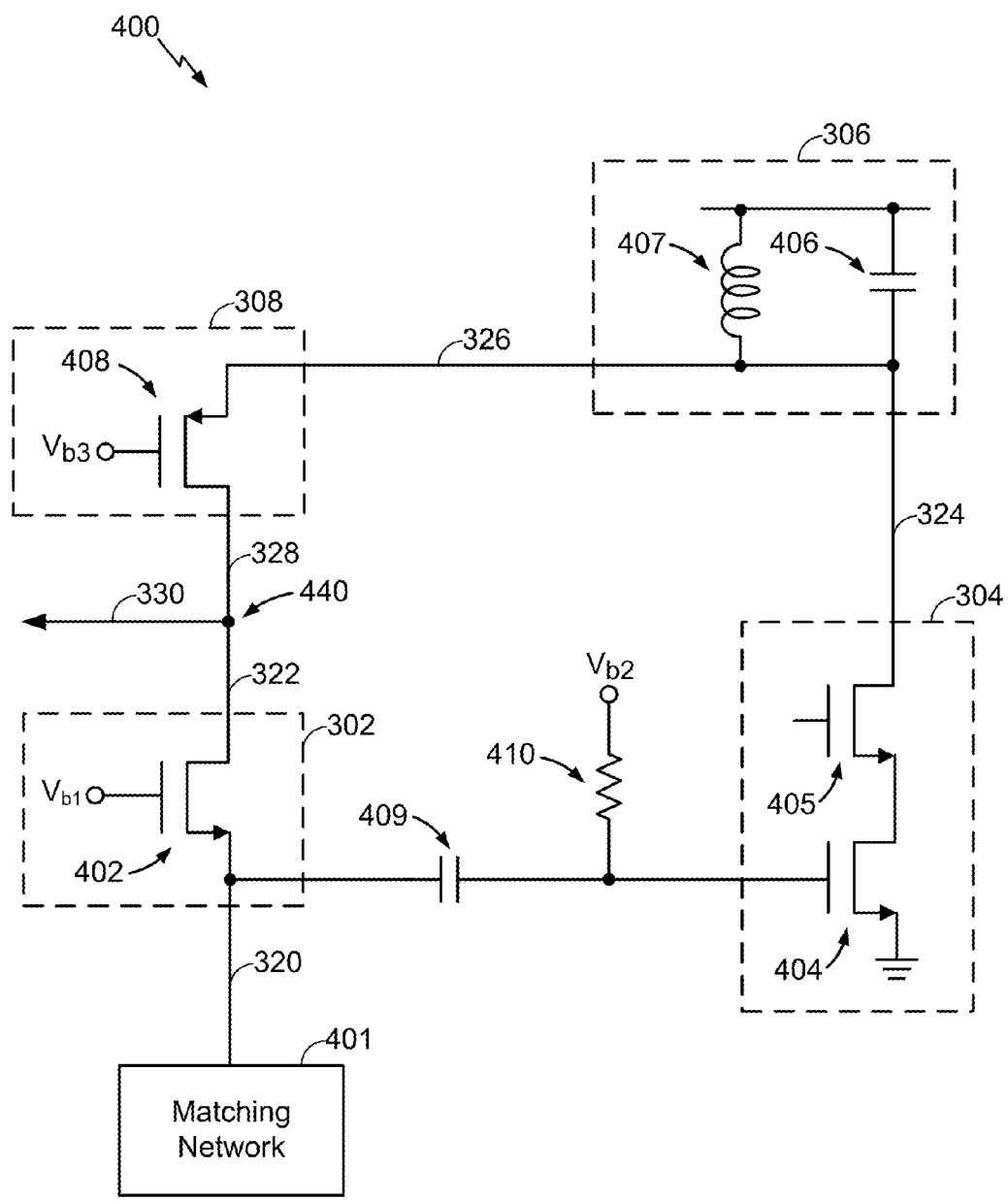
FIG. 4 is a diagram that depicts an exemplary embodiment of a circuit that is operable to amplify signal components and reduce blocker components.

Referring to FIG. 4, an exemplary embodiment of a circuit 400 that is operable to amplify signal components and reduce blocker components is shown. The circuit 400 may include the main amplifier 302, the first auxiliary amplifier 304, the load 306, and the second auxiliary amplifier 308. The circuit 400 may also include a matching network 401. In an exemplary embodiment, the circuit 400 may correspond to a low noise amplifier (LNA). In other embodiments, the circuit 400 may correspond to (or may be included in) other amplifiers (e.g., a power amplifier, an RF power amplifier, etc.). The circuit 400 may be included in a wideband receiver.

The matching network 401 may be configured to match an impedance of the input signal 320 to an impedance of an antenna (not shown). The matching network 401 may provide the input signal 320 to the main amplifier 302. The main amplifier 302 may include a first transistor 402. The first transistor 402 may be an n-type metal oxide semiconductor (NMOS) transistor. The first transistor 402 may be a common-gate transistor having a (low-impedance) source coupled to the matching network 401 and a (high-impedance) drain coupled to provide the first output signal 322 to a summing node 440. A first voltage ($V_{b1}$) may be applied to a gate of the first transistor 402. The first voltage ($V_{b1}$) may be adjustable to control the gain of the main amplifier 302. For example, adjusting the first voltage ($V_{b1}$) may adjust the amplitude of the signal components and the blocker components provided at the drain of the first transistor 402.

The input signal 320 may also be provided to the first auxiliary amplifier 304 via a capacitor 409. The first auxiliary amplifier 304 may include a second transistor 404 and a third transistor 405 (e.g., a pair of cascaded transistors). The second transistor 404 and the third transistor 405 may be NMOS transistors. The second transistor 404 may be a common source transistor. For example, a source of the second transistor 404 may be coupled to ground, a gate of the second transistor 404 may be coupled to receive the input signal 320, and a drain of the second transistor 404 may be coupled to a source of the third transistor 405. The topology of the second transistor 404 (e.g., the common source topology) may generate approximately a 180 degree phase shift of the input signal 320. For example, signal components and blocker components of the input signal 320 that are provided to the second transistor 404 may undergo a 180 degree phase shift.

The second transistor 404 may also adjust the amplitude (e.g., the gain) of the signal components and blocker components of the input signal 320. In an exemplary embodiment, a second voltage ($V_{b2}$) across a resistor 410 that is coupled to the gate of the second transistor 404 may be adjusted to adjust the amplitude of the signal components and the blocker components of the input signal 320 provided to the first auxiliary amplifier 304. In another exemplary embodiment, additional common source transistors (not shown) may be selectively coupled (e.g., activated) in parallel with the second transistor 404 to adjust the amplitude of the signal components and the blocker components. For example, the first auxiliary amplifier 304 may include at least one common source transistor, and the gain of the first auxiliary amplifier 304 may be adjustable via selection of a common source transistor of the at least one common source transistor. In another exemplary embodiment, the second voltage ($V_{b2}$) may be adjusted and additional common source transistors may be coupled in parallel with the second transistor 404 to adjust the amplitude of the signal components and the blocker components. The first auxiliary amplifier 304 may generate the amplified phase-adjusted signal 324 by adjusting the amplitude and the phase of the input signal 320. The amplified phase-adjusted signal 324 may be provided to the load 306.

The load 306 includes a capacitor 406 coupled in parallel with an inductor 407. In an illustrative embodiment, the load 306 is depicted as a band-pass filter. The load 306 may be tuned to the blocker frequency (or to a frequency band that includes the blocker frequency) to pass the blocker frequency and to remove (or substantially reduce) components of the amplified phase-adjusted signal 324 that are associated with the target frequency (e.g., remove or substantially reduce signal components). For example, the capacitance of the capacitor 406 and the inductance of the inductor 407 may be tuned (e.g., adjusted) such that components of the amplified phase-adjusted signal 324 having the blocker frequency are passed (e.g., provided) to the second auxiliary amplifier 308 and components of the amplified phase-adjusted signal 324 having other frequencies (e.g., signal components) are removed or substantially reduced (e.g., filtered out). Thus, the load 306 may generate the amplified phase-adjusted blocker signal 326 by removing signal components from the amplified phase-adjusted signal 324. The amplified phase-adjusted blocker signal 326 may be provided to the second auxiliary amplifier 308.

Although the load 306 is depicted as a band-pass filter, in other embodiments, the load 306 may correspond to other filters. For example, in an exemplary embodiment, the load 306 may include a high-pass filter. For example, the load 306 may be tuned to pass components (e.g., blocker components) of the amplified phase-adjusted signal 324 having frequencies above an exemplary frequency. Components having frequencies that are below the exemplary level (e.g., signal components) may be removed (or substantially reduced). In another exemplary embodiment, the load 306 may include a low-pass filter. For example, the load 306 may be tuned to pass components (e.g., blocker components) of the amplified phase-adjusted signal 324 having frequencies below an exemplary frequency. Components having frequencies that are above the exemplary level (e.g., signal components) may be removed (or substantially reduced).

The second auxiliary amplifier 308 may include a fourth transistor 408. The fourth transistor 408 may be a p-type metal oxide semiconductor (PMOS) transistor. The fourth transistor 408 may be a common-gate transistor having a source coupled to receive the amplified phase-adjusted blocker signal 326 and a drain coupled to provide the cancellation signal 328. A third voltage ($V_{b3}$) may be applied to a gate of the fourth transistor 408. The third voltage ($V_{b3}$) may be adjustable to control the gain of the second auxiliary amplifier 308. For example, adjusting the third voltage ($V_{b3}$) may adjust the amplitude of the amplified phase-adjusted blocker signal 326 provided as the cancellation signal 328.

The amplifiers 302, 304, 308 may be tuned such that the amplitude of the cancellation signal 328 is approximately equal to the amplitude of the blocker components of the first output signal 322. For example, the first voltage ($V_{b1}$) may be adjusted such that the amplitude of the blocker components of the first output signal 322 is at an exemplary level. In addition, the second voltage ($V_{b2}$) and the third voltage ($V_{b3}$) may be adjusted such that the amplitude of the cancellation signal 328 is also at (or approximately at) the exemplary level.

The cancellation signal 328 (e.g., a current signal) and the first output signal 322 (e.g., a current signal) may be provided to a summing node 440 to generate the resulting signal 330 having the target frequency. For example, the cancellation signal 328 may reduce (or cancel) blocker components of the first output signal 322, and the signal components (e.g., components having the target frequency) of the first output signal 322 may be provided as the resulting signal 330. In an exemplary embodiment, the summing node 440 may correspond to the combiner 310 of FIG. 3.

The circuit 400 of FIG. 4 may reduce (or cancel) blocker components in the input signal 320 by combining the first output signal 322 with the cancellation signal 328. Removing (or reducing) the blocker components of the inputs signal 320 may improve sensitivity of amplification systems (e.g., LNA systems) for wide band receiving applications.

Figure 5:
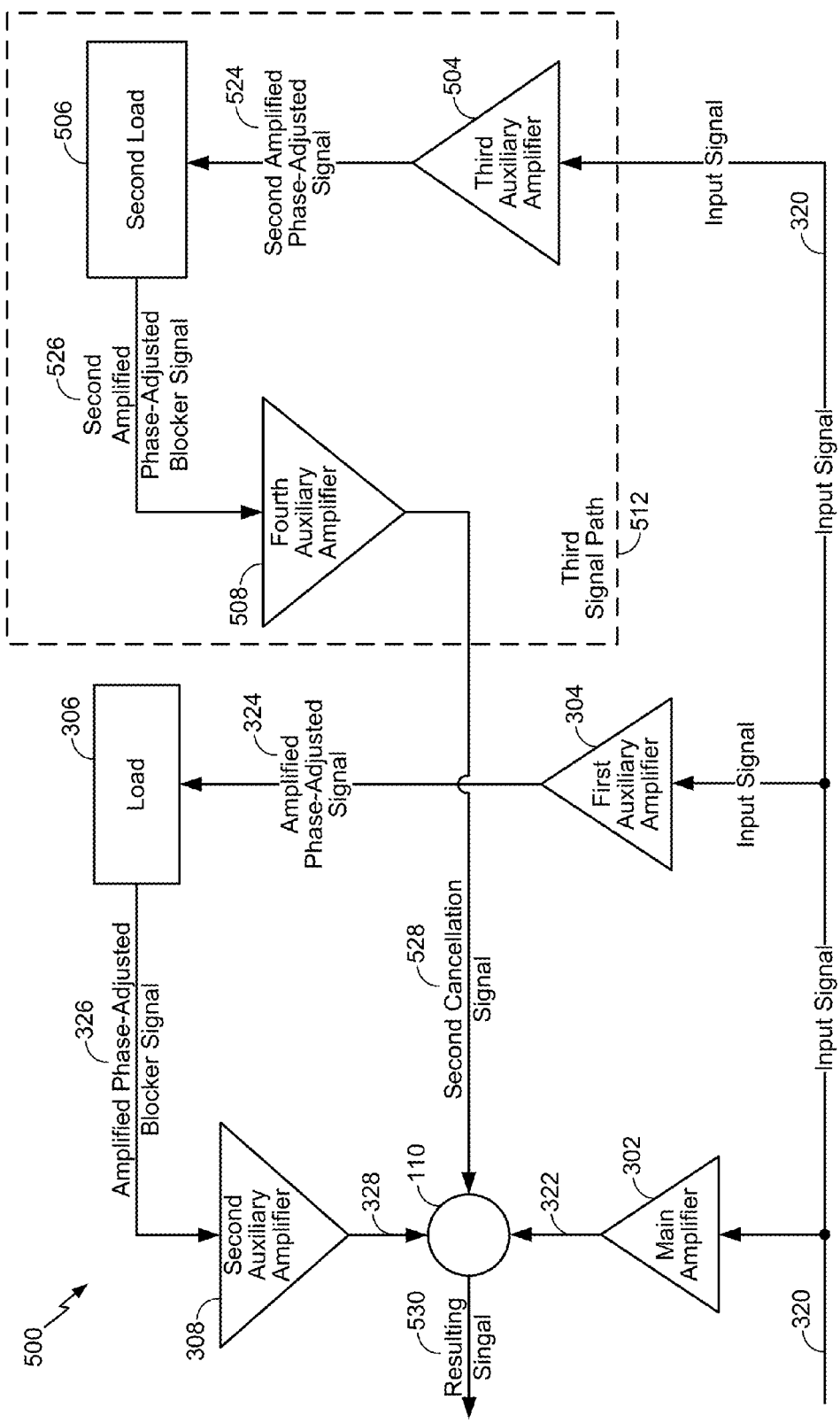
FIG. 5 is a block diagram that depicts an exemplary embodiment of a system that is operable to amplify signal components and reduce multiple blocker components.

Referring to FIG. 5, an exemplary embodiment of a system 500 that is operable to amplify signal components and reduce multiple blocker components is shown. The system 500 includes components of the system 300 of FIG. 3, such as the main amplifier 302, the first auxiliary amplifier 304, the load 306, the second auxiliary amplifier 308, and the combiner 310. The system 500 also includes a third auxiliary amplifier 504, a second load 506, and a fourth auxiliary amplifier 508. The third auxiliary amplifier 504, the second load 506, and the fourth auxiliary amplifier 508 may be included in a third signal path 512 (e.g., a feed-forward path) that is configured to reduce (or cancel) additional blocker components of the first signal path. In an exemplary embodiment, the system 500 may correspond to an LNA. In other embodiments, the system 500 may correspond to other amplifiers (e.g., a power amplifier, an RF power amplifier, etc.). The system 500 may be included in a wideband receiver.

The third auxiliary amplifier 504 is coupled to receive the input signal 320. The third auxiliary amplifier 504 may be configured to amplify the input signal 320 and adjust the phase of the input signal 320 in a substantially similar manner as the first auxiliary amplifier 304. For example, the third auxiliary amplifier 504 may perform a "third amplification" and amplify the signal components and the blocker components of the input signal 320 by a third gain factor. In an exemplary embodiment, the third gain factor may be less than the main gain factor associated with the main amplifier 302. The third auxiliary amplifier 504 may also adjust the phase of the input signal 320 by approximately 180 degrees. Performing the third amplification and adjusting the phase of the input signal 320 at the third auxiliary amplifier 504 produces a second amplified phase-adjusted signal 524. The second amplified phase-adjusted signal 524 may be provided to the second load 506.

The second load 506 is coupled to receive the second amplified phase-adjusted signal 524. The second load 506 may operate as a filter (e.g., a second notch filter) that is tuned to a second blocker frequency. The second load 506 may include a band-pass filter, a low-pass filter, or a high-pass filter. The second load 506 may operate in a substantially similar manner as the load 306 with respect to a second blocker frequency. For example, the load 306 may be tuned to a first blocker frequency to pass blocker components having the first blocker frequency, and the second load 506 may be tuned to the second blocker frequency (e.g., a different blocker frequency) to pass blocker components having the second blocker frequency (e.g., second blocker components). In an exemplary embodiment, the first blocker frequency may be a first exemplary harmonic of the target frequency, and the second blocker frequency may be a different harmonic of the target frequency. As a non-limiting example, the first blocker frequency may be the third harmonic of the target frequency, and the second blocker frequency may be the fifth harmonic of the target frequency. Passing the second blocker components may generate a second amplified phase-adjusted blocker signal 526 having the second blocker frequency.

In an exemplary embodiment, the first blocker frequency and the second blocker frequency may have an overlapping frequency bandwidth. In another exemplary embodiment, the first blocker frequency and the second blocker frequency may have non-overlapping bandwidths.

The fourth auxiliary amplifier 508 is coupled to receive the second amplified phase-adjusted blocker signal 526. The fourth auxiliary amplifier 508 may operate in a substantially similar manner as the second auxiliary amplifier 308. For example, the fourth auxiliary amplifier 508 may be configured to amplify the second amplified phase-adjusted blocker signal 526 to generate a second cancellation signal 528 having the second blocker frequency. The second cancellation signal 528 may also be provided to the combiner 310.

The amplitude of the second blocker components in the first output signal 322 from the main amplifier 302 may be approximately equal to the amplitude of the second blocker components in the second cancellation signal 528 from the third signal path 512. In addition, the first output signal 322 may be approximately 180 degrees out of phase with the second cancellation signal 528. Thus, the second blocker components in the first output signal 322 from the main amplifier 302 and the second blocker components in the second cancellation signal 528 from the third signal path 512 have approximately equal amplitudes and are approximately 180 degrees out of phase.

The combiner 310 may combine the first output signal 322 with the cancellation signal 328 and the second cancellation signal 528 to generate a resulting signal 530 having the target frequency. For example, the cancellation signal 328 may reduce (or cancel) blocker components of the first output signal 322 having the first blocker frequency, and the second cancellation signal 528 may reduce (or cancel) second blocker components of the first output signal 322 having the second blocker frequency. The signal components (e.g., components having the target frequency) of the first output signal 322 may be provided as the resulting signal 530.

The system 500 of FIG. 5 may reduce (or cancel) different blocker components in the input signal 320. For example, different signal paths 312, 512 (e.g., feed-forward paths) may include different loads 306, 506 that are tuned to different blocker frequencies. The signal paths 312, 512 may generate cancellation signals 328, 528 based on the respective blocker frequencies to reduce (or cancel) corresponding blocker components of the first output signal 322. Although the system 500 of FIG. 5 depicts two signal paths that are configured to reduce (or cancel) two blocker frequencies, in other embodiments, additional signal paths (e.g., feed-forward paths) may be added to cancel additional blocker frequencies. As a non-limiting example, five signal paths may be added to the system 500 to cancel five additional blocker frequencies.

Figure 6:
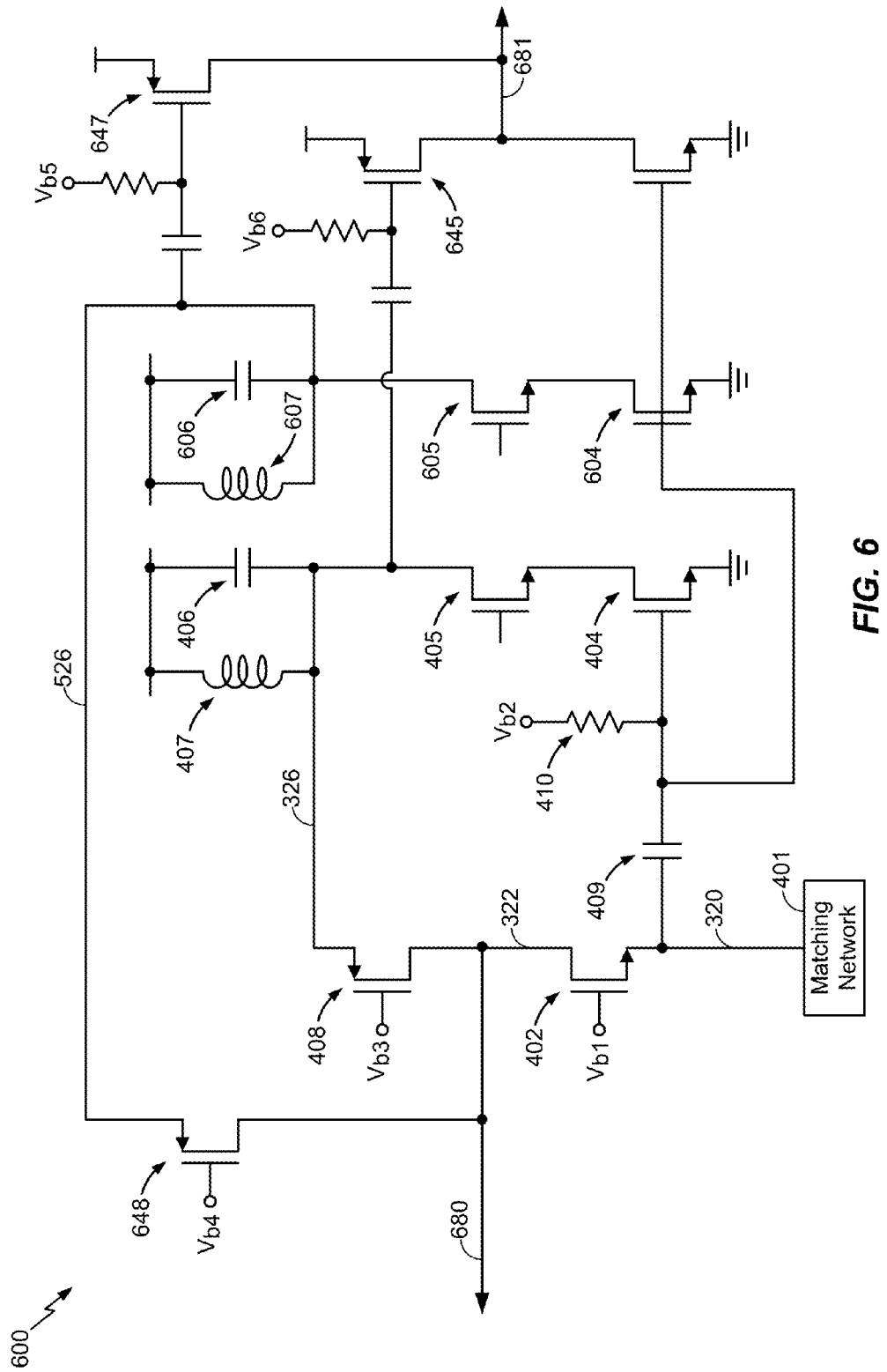
FIG. 6 is a diagram that depicts an exemplary embodiment of a circuit that is operable to amplify signal components and reduce multiple blocker components.

Referring to FIG. 6, an exemplary embodiment of a circuit 600 that is operable to amplify signal components and reduce multiple blocker components is shown. The circuit 600 includes circuit components of the circuit 400 of FIG. 4, such as the matching network 401, the first transistor 402, the second transistor 404, the third transistor 405, the fourth transistor 408, the capacitor 406, and the inductor 407. The circuit 600 also includes additional circuit components to remove additional blocker components, as described below. In an exemplary embodiment, the circuit 600 may correspond to a differential LNA with multiple notches. In other embodiments, the circuit 600 may correspond to other differential amplifiers (e.g., a differential power amplifier, a differential RF power amplifier, etc.) with multiple notches. The circuit 600 may be included in a wideband receiver.

The circuit 600 may include a fifth transistor 604 and a sixth transistor 605. The fifth and the sixth transistors 604, 605 may be NMOS transistors. In an exemplary embodiment, the fifth transistor 604 and the sixth transistor 605 may be included in the third auxiliary amplifier 504 of FIG. 5. The fifth transistor 604 may be a common source transistor. For example, a source of the fifth transistor 604 may be coupled to ground, a gate of the fifth transistor 604 may be coupled to receive the input signal 320, and a drain of the fifth transistor 604 may be coupled to a source of the sixth transistor 605. The topology of the fifth transistor 604 (e.g., the common source topology) may generate approximately a 180 degree phase shift of the input signal 320. For example, signal components and blocker components of the input signal 320 that are provided to the fifth transistor 604 may undergo a 180 degree phase shift.

The fifth transistor 604 may also adjust the amplitude of the signal components and the blocker components of the input signal 320. In an exemplary embodiment, the second voltage ($V_{b2}$) across the resistor 410 that is coupled to the gate of the fifth transistor 604 may be adjusted to adjust the amplitude of the signal components and the blocker components. Thus, the second voltage ($V_{b2}$) may adjust the gain associated with the second transistor 404 and the gain associated with the fifth transistor 604. In another exemplary embodiment, additional common source transistors (not shown) may be coupled in parallel with the fifth transistor 604 to adjust the amplitude of the signal components and the blocker components. In another embodiment, the second voltage ($V_{b2}$) may be adjusted and additional common source transistors may be coupled in parallel with the fifth transistor 604 to adjust the amplitude of the signal components and the blocker components.

A capacitor 606 may be coupled in parallel with an inductor 607 as a band-pass filter. The capacitor 606 and the inductor 607 may correspond to the second load 506 of FIG. 5. The band-pass filter may be tuned to the second blocker frequency to pass the second blocker components. Passing the second blocker components may generate the second amplified phase-adjusted blocker signal 526 having the second blocker frequency.

The second amplified phase-adjusted blocker signal 526 may be provided to a gate of a seventh transistor 647 (via a capacitor) and to a source of an eighth transistor 648. The topology of the seventh transistor 647 may differ from the topology of the eighth transistor 648 to enable approximately a 180 degree phase shift of the differential outputs 680, 681. For example, the seventh transistor 647 may be a common source transistor, and the eighth transistor 648 may be a common gate transistor. The seventh and the eighth transistors 647, 648 may be PMOS transistors. A drain of the eighth transistor 648 may be coupled to a first differential output 680, and a drain of the seventh transistor 647 may be coupled to a second differential output 681. A fourth voltage ($V_{b4}$)

may be applied to a gate of the eighth transistor 648. The fourth voltage ($V_{b4}$) may be adjustable to control the amplitude of the second phase adjusted blocker signal 526 provided to the first differential output 680 as a cancellation signal for the second blocker frequency. A fifth voltage ($V_{b5}$) may be coupled (via a resistor) to a gate of the seventh transistor 647. The fifth voltage ($V_{b5}$) may be adjustable to control the amplitude of the second phase adjusted blocker signal 526 provided to the second differential output 681 as a cancellation signal for the second blocker frequency.

The amplified phase-adjusted blocker signal 326 may be provided to the source of the fourth transistor 408 and to a gate of a ninth transistor 645 (via a capacitor). The drain of the fourth transistor 408 may be coupled to the first differential output 680, and the drain of the ninth transistor 645 may be coupled to the second differential output 681. The ninth transistor 645 and the seventh transistor 647 may be common source transistors having drains coupled to the second differential output 681. The third voltage ($V_{b3}$) may be adjustable to control the amplitude of the phase adjusted blocker signal 326 provided to the first differential output 680 as a cancellation signal for the first blocker frequency. A sixth voltage ($V_{b6}$) may be coupled (via a resistor) to a gate of the ninth transistor 645. The sixth voltage ($V_{b6}$) may be adjustable to control the amplitude of the phase adjusted blocker signal 326 provided to the second differential output 681 as a cancellation signal for the first blocker frequency.

The circuit 600 of FIG. 6 may reduce (or cancel) different blocker components in the input signal 320. For example, a first load (e.g., the capacitor 406 and the inductor 407) may be tuned to the first blocker frequency to generate a differential cancellation signal to reduce blocker components of the input signal 320 having the first blocker frequency. The second load (e.g., the capacitor 606 and the inductor 607) may be tuned to the second blocker frequency to generate a differential cancellation signal to reduce blocker components of the input signal 320 having the second blocker frequency. It will be appreciated that the circuit 600 of FIG. 6 may generate multiple cancellation signals to reduce (or cancel) blocker components at multiple frequencies.

Figure 7:
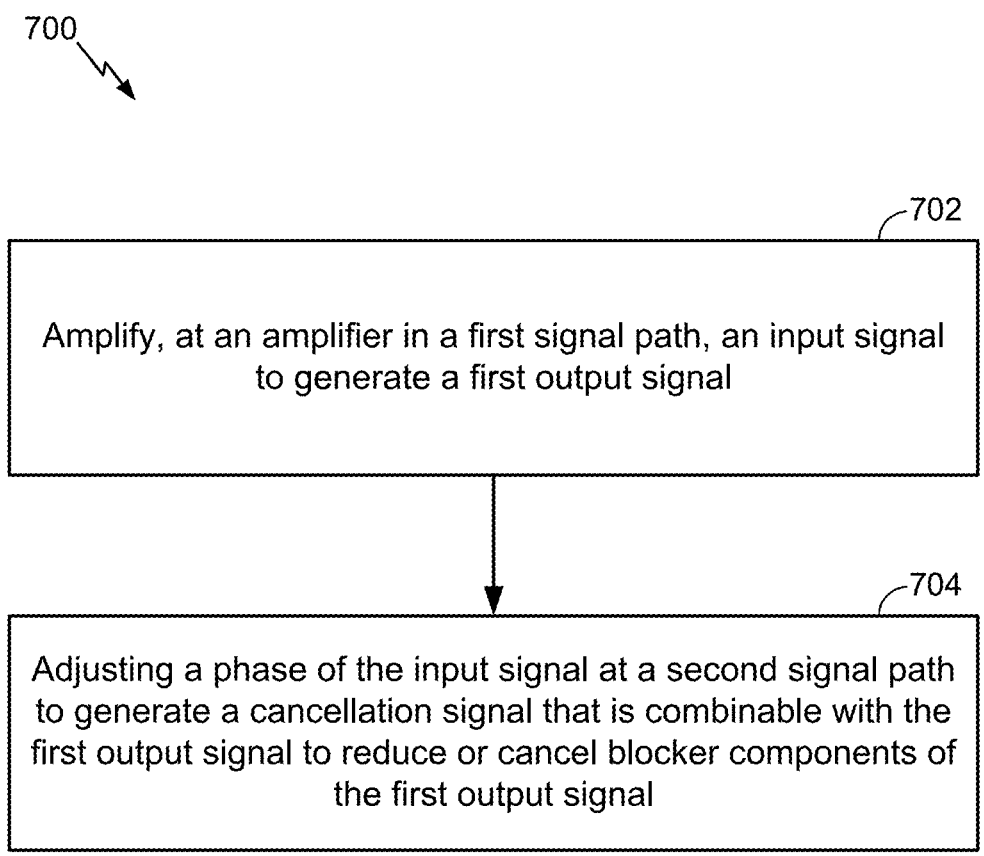
FIG. 7 is a flowchart that illustrates an exemplary embodiment of a method for amplifying signal components and reducing blocker components.

Referring to FIG. 7, a flowchart that illustrates an exemplary embodiment of a method for amplifying signal components and reducing blocker components is shown. In an illustrative embodiment, the method 700 may be performed using the wireless device 110 of FIGS. 1-2, the system 300 of FIG. 3, the circuit 400 of FIG. 4, the system 500 of FIG. 5, the circuit 600 of FIG. 6, or any combination thereof.

The method 700 includes amplifying, at an amplifier in a first signal path, an input signal to generate a first output signal, at 702. For example, referring to FIG. 3, the main amplifier 302 may amplify the input signal 320 to generate the first output signal 322. The input signal 320 may include signal components having a target frequency and blocker components having a blocker frequency. The main amplifier 302 may perform a "main amplification" and amplify the signal components and the blocker components of the input signal 320 by a main gain factor. The first output signal 322 may include signal components having the target frequency and blocker components having the blocker frequency.

The method 700 may also include adjusting a phase of the input signal at a second signal path to generate a cancellation signal that is combinable with the first output signal to reduce or cancel blocker components of the first output signal, at 704. For example, referring to FIG. 3, the first auxiliary amplifier 304 may amplify the input signal 320 and adjust the phase of the input signal 320. The first auxiliary amplifier 304 may perform a "first amplification" and amplify the signal components and the blocker components of the input signal 320 by a first gain factor. In an exemplary embodiment, the first gain factor may be less than the main gain factor associated with the main amplifier 302. The first auxiliary amplifier 304 may also adjust the phase of the input signal 320 by approximately 180 degrees. Performing the first amplification and adjusting the phase of the input signal 320 at the first auxiliary amplifier 304 may produce the amplified phase-adjusted signal 324. The load 306 may operate as a filter (e.g., a notch filter) that is tuned to the blocker frequency. The load 306 may remove components of the amplified phase-adjusted signal 324 that are associated with the target frequency (e.g., remove signal components). The load 306 may pass components of the phase-adjusted signal 324 that are associated with the blocker frequency (e.g., blocker components) to generate the amplified phase-adjusted blocker signal 326 having the blocker frequency. The second auxiliary amplifier 308 may amplify the amplified phase-adjusted blocker signal 326 to generate the cancellation signal 328 having the blocker frequency. For example, the second auxiliary amplifier 308 may perform a "second amplification" and amplify the amplified phase-adjusted blocker signal 326 by the second gain factor.

In an exemplary embodiment, the method 700 may include adjusting a voltage applied to a gate of at least one common source transistor of an auxiliary amplifier in the second signal path to adjust a gain of the auxiliary amplifier. For example, referring to FIG. 4, the second voltage ($V_{b2}$) across the resistor 410 that is coupled to the gate of the second transistor 404 may be adjusted to adjust the amplitude of the signal components and the blocker components of the input signal 320 provided to the first auxiliary amplifier 304.

In an exemplary embodiment, the method 700 may include selecting at least one common source transistor of the auxiliary amplifier in the second signal path to adjust the gain of the auxiliary amplifier. For example, referring to FIG. 4, additional common source transistors (not shown) may be selectively coupled (e.g., activated) in parallel with the second transistor 404 to adjust the amplitude of the signal components and the blocker components. The first auxiliary amplifier 304 may include at least one common source transistor, and the gain of the first auxiliary amplifier 304 may be adjustable via selection of an exemplary common source transistor of the at least one common source transistor.

In an exemplary embodiment, the method 700 may include adjusting a voltage applied to a gate of a common gate transistor of a main amplifier in the first signal path to adjust a gain of the main amplifier. For example, referring to FIG. 4, the first voltage ($V_{b1}$) may be adjustable to control the gain of the main amplifier 302 (e.g., adjusting the first voltage ($V_{b1}$) may adjust the amplitude of the signal components and the blocker components provided at the drain of the first transistor 402).

In an exemplary embodiment, the method 700 may include combining the first output signal and the cancellation signal. For example, referring to FIG. 3, the first output signal 322 may be approximately 180 degrees out of phase with the cancellation signal 328 (e.g., the phase shift of the input signal 320 at the first auxiliary amplifier 304 may result in the first output signal 322 being approximately 180 degrees out of phase with the cancellation signal 328). Thus, the blocker components from the main amplifier 302 and the blocker components from the second signal path 312 (e.g., the cancellation signal 328) may have approximately equal amplitudes and may be approximately 180 degrees out of phase. The combiner 310 may combine the first output signal 322 with the cancellation signal 328 to generate the resulting signal 330 having the target frequency. For example, the cancellation signal 328 may reduce (or cancel) blocker components of the first output signal 322, and the signal components (e.g., components having the target frequency) of the first output signal 322 may be provided as the resulting signal 330.

The method 700 of FIG. 7 may reduce (or cancel) blocker components in the input signal 320. For example, the main amplifier 302 may pass signal components and blocker components to the combiner 310, and the load 306 may filter out (e.g., remove) signal components such that blocker components (that are phase shifted) are passed to the combiner 310. Blocker reduction (or cancellation) may occur at the combiner 310. For example, the amplitude of the blocker components provided by the main amplifier 302 may be approximately equal to the amplitude of the blocker components provided by the second signal path 312 (e.g., the first auxiliary amplifier and the second auxiliary amplifier 308). In addition, the blocker components provided by the second signal path 312 may have an opposite phase (e.g., a 180 degree phase shift) as the blocker components provided by the main amplifier 302, which causes blocker cancellation (or reduction).

In conjunction with the described embodiments, an apparatus includes means for amplifying an input signal to generate a first output signal. The input signal may include signal components having a target frequency and blocker components having a blocker frequency. For example, the means for amplifying the input signal may include the wireless device 110 of FIGS. 1-2, the main amplifier 302 of FIGS. 3-5, the first signal path of FIG. 3, the first transistor 402 of FIGS. 4 and 6, one or more other devices, circuits, modules, or instructions to amplify the input signal, or any combination thereof.

The apparatus may also include means for adjusting a phase of the input signal to generate a cancellation signal that is combinable with the first output signal to reduce or cancel blocker components of the first output signal. For example, the means for adjusting the phase of the input signal may include the wireless device 110 of FIGS. 1-2, the first auxiliary amplifier 304 of FIG. 3, the second signal path 312 of FIG. 3, the second transistor 404 of FIG. 4, the third transistor 405 of FIG. 4, the third auxiliary amplifier 504 of FIG. 5, the third signal path 512 of FIG. 5, the fifth transistor 604 of FIG. 6, the sixth transistor 605 of FIG. 6, one or more other devices, circuits, modules, or instructions to adjust the input signal, or any combination thereof.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a main amplifier configured to receive an input signal, and to generate an output signal, the output signal including a target signal and at least one blocker signal;
an auxiliary path configured to phase-shift the input signal to generate a cancellation signal, the auxiliary path including:
a first auxiliary amplifier configured to receive the input signal and to generate an amplified phase-adjusted target signal and an amplified phase-adjusted blocker signal;
a filter configured to separate the amplified phase-adjusted blocker signal from the amplified phase-adjusted target signal; and
a second auxiliary amplifier configured to receive the amplified phase-adjusted blocker signal and to generate the cancellation signal to reduce or cancel at least one blocker signal of the output signal.

2. The apparatus of claim 1, wherein the cancellation signal is substantially 180 degrees out of phase with the at least one blocker signal.

3. The apparatus of claim 1, further comprising a combiner-coupled to receive the output signal and the cancellation signal.

4. The apparatus of claim 3, wherein the combiner is a summing node.

5. The apparatus of claim 3, wherein the at least one blocker signal is a harmonic of the target signal.

6. The apparatus of claim 1, wherein the cancellation signal comprises a phase shifted version of the at least one blocker signal.

7. The apparatus of claim 1, wherein the cancellation signal is a first cancellation signal, the output signal includes a second blocker signal, and the auxiliary path is a first auxiliary path, and further comprising a second auxiliary path to filter and phase-shift the input signal to generate a second cancellation signal, the second cancellation signal combinable with the output signal to reduce or cancel the second blocker signal of the output signal.

8. The apparatus of claim 1, wherein the apparatus includes one of a low noise amplifier, a power amplifier, a transceiver and a receiver.

9. The apparatus of claim 8, wherein the first auxiliary amplifier comprises at least one common source transistor.

10. The apparatus of claim 1, wherein the main amplifier, the first auxiliary amplifier, and the filter are integrated within a single integrated circuit.

11. The apparatus of claim 1, wherein the first auxiliary amplifier comprises a pair of cascaded transistors.

12. The apparatus of claim 8, wherein the filter is tuned to a blocker frequency of the at least one blocker signal.

13. The apparatus of claim 1, wherein the main amplifier comprises a common gate transistor.

14. An apparatus comprising:
- means for amplifying, at a first signal path, an input signal to generate a first output signal, the first output signal including a target signal and at least one blocker signal;
- means for amplifying and phase shifting, at a second signal path, the input signal to generate an amplified phase-adjusted target signal and an amplified phase-adjusted blocker signal;
- means for separating, at the second signal path, the amplified phase-adjusted blocker signal from the amplified phase-adjusted target signal; and
- second means for amplifying, at the second signal path, the amplified phase-adjusted blocker signal to generate a cancellation signal that is combinable with the first output signal to reduce or cancel blocker components of the first output signal.

15. The apparatus of claim 14, wherein the means for amplifying is included in a main signal path of a low noise amplifier (LNA), and wherein the means for separating is included in an auxiliary signal path of the LNA.

16. A method comprising:
- amplifying, at an amplifier in a first signal path, an input signal to generate a first output signal, the first output signal including a target signal and at least one blocker signal;
- amplifying and phase shifting, at a second signal path, the input signal to generate an amplified phase-adjusted target signal and an amplified phase-adjusted blocker signal;
- filtering, at the second signal path, to separate the amplified phase-adjusted blocker signal from the amplified phase-adjusted target signal; and
- amplifying, at the second signal path, the amplified phase-adjusted blocker signal to generate a cancellation signal that is combinable with the first output signal to reduce or cancel at least one blocker signal of the first output signal.

17. The method of claim 16, further comprising:
- adjusting a voltage applied to a gate of at least one common source transistor of an auxiliary amplifier in the second signal path to adjust a gain of the auxiliary amplifier; or
- selecting at least one common source transistor of the auxiliary amplifier in the second signal path to adjust the gain of the auxiliary amplifier.

18. The method of claim 16, further comprising adjusting a voltage applied to a gate of a common gate transistor of a main amplifier in the first signal path to adjust a gain of the main amplifier.

19. The method of claim 16, further comprising generating a second cancellation signal at a third signal path, and combining the second cancellation signal with the output signal.

20. The method of claim 16, wherein the cancellation signal is substantially 180 degrees out of phase with the at least one blocker signal.

* * * * *